United States Patent [19]

Cardinal

[11] 4,217,683
[45] Aug. 19, 1980

[54] METHOD FOR RESISTANCE WELDING OF AN ELECTRO-OPTIC DEVICE HOUSING

[75] Inventor: Rene E. Cardinal, Montreal, Canada

[73] Assignee: RCA Corporation, New York, N.Y.

[21] Appl. No.: 971,909

[22] Filed: Dec. 21, 1978

[30] Foreign Application Priority Data

Oct. 23, 1978 [CA] Canada .................................. 313897

[51] Int. Cl.² .............................................. H01J 9/24
[52] U.S. Cl. .................................................. 29/25.13
[58] Field of Search ............... 29/25.13; 219/107, 119, 219/78.01, 98, 99, 161

[56] References Cited

U.S. PATENT DOCUMENTS

| 2,813,218 | 11/1957 | Klopping et al. | 219/107 X |
| 3,293,402 | 12/1966 | Graham | 219/161 |
| 4,097,712 | 6/1978 | Bezold | 219/107 |

Primary Examiner—Richard B. Lazarus
Attorney, Agent, or Firm—H. Christoffersen; B. E. Morris; W. J. Burke

[57] ABSTRACT

A method and apparatus for welding a header to a heat sensitive cap to form an electro-optic device housing without weld flanges. A collet electrode is used to provide a radially compressive force which provides good electric and thermal contact to the wall of the heat sensitive cap and maintains the glass to metal seal under compression.

2 Claims, 3 Drawing Figures

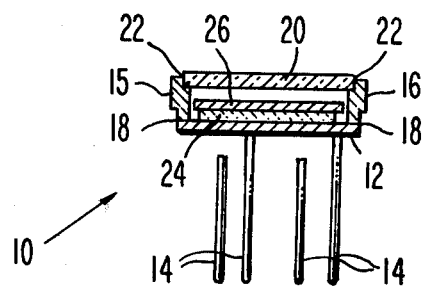
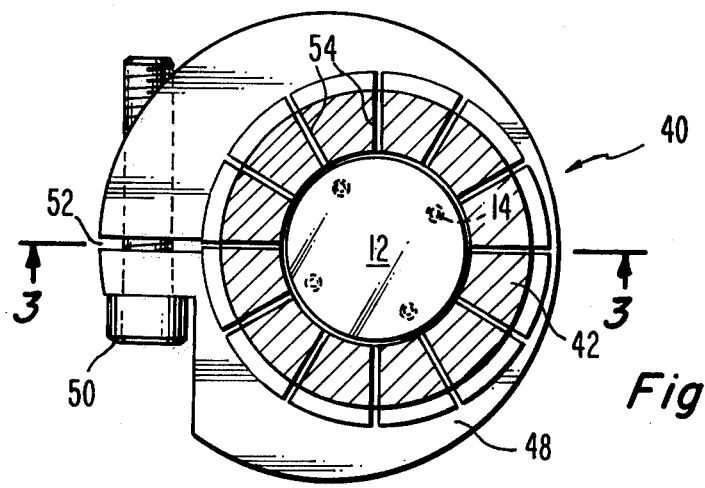
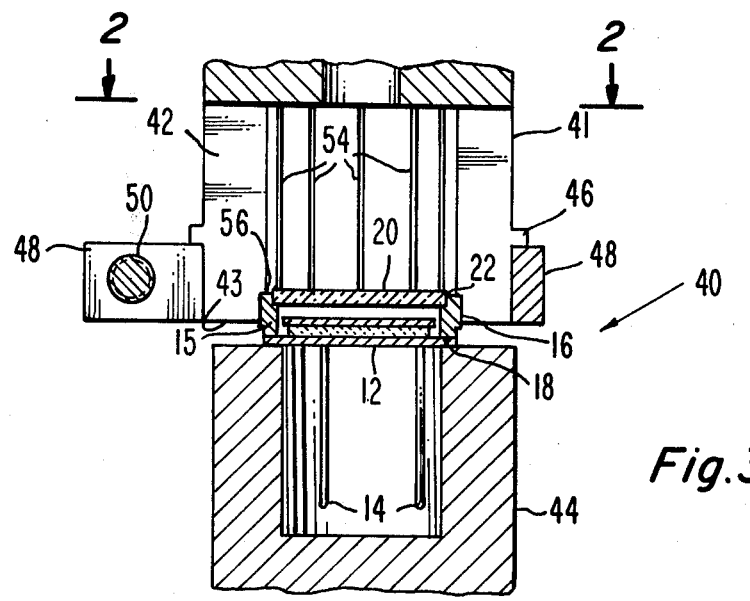

METHOD FOR RESISTANCE WELDING OF AN ELECTRO-OPTIC DEVICE HOUSING

This invention relates to a method and apparatus for welding a header to a cap to form a device housing.

BACKGROUND OF THE INVENTION

Electro-optic devices such as light sources and detectors are becoming of increased technological importance in communications, range finding and target designation applications. In applications such as these the device housing must provide optical and electrical access to the electro-optic device as well as a hermetic seal against the ambient. The profile of the device housing is also oftentimes important in certain applications.

Electro-optic device housings typically are similar to that described by Collins et al, U.S. Pat. No. 3,805,347, issued Apr. 23, 1974, which shows a cap, which contains a window, fastened to a header at a projecting flange. Techniques used for fastening the cap to the header at the projecting flanges include soldering, electrical resistance welding, as described for example in the RWMA Manual published by the Resistance Welders Manufacturer's Association, and cold pressure welding as described in U.S. Pat. No. 3,309,175, issued June 19, 1962, to Dixon.

To obtain a hermetically sealed package a glass to metal seal of the window to the housing cap and standard resistance welding at the projecting flanges can be used when the window is separated from the weld flange by a suitable distance such that the window is not heated to a significant degree during the welding process. Significant heating of the glass to metal sealing joint can lead to failure of the seal or to cracking of the window. If the window-to-flange spacing is small then proper heat sinking is required in order to protect the glass to metal seal.

For some applications an electro-optic device housing without projecting flanges is required. The cap and header must then be butt welded to one another to form the required hermetic seal. In this case the welding electrode must contact the wall of the cap on its perimeter. This electrode must provide good electrical and thermal contact to the wall to minimize electrical and thermal contact resistance. Electrical contact resistance must be minimized so that the applied electrical power is dissipated at the point of welding. Thermal contact resistance must be minimized so that the electrode can provide a heat sink for heat generated at the weld joint which diffuses into the wall of the cap.

Thus, it would be desirable to have a method and apparatus for butt welding a heat sensitive cap to a header which minimizes the electrical and thermal contact resistance between the cap and the header.

SUMMARY OF THE INVENTION

The invention is a method and apparatus for resistance welding a cap having a heat sensitive area to a header to form a device housing without a weld flange which comprises mounting said cap in a collet electrode, tightening the collet electrode about said cap for compressing the wall of said cap and for providing thermal and electrical contact to the wall of said cap, mounting said header on said cap, mounting a second electrode on the perimeter of said header for forcing the header against the end of the wall of the cap, passing an electrical energy pulse of sufficient magnitude between the collet electrode and the second electrode through said header and the wall of said cap for welding said cap and said header together whereby said heat sensitive area is not disturbed.

BRIEF DESCRIPTION OF THE DRAWINGS

FIG. 1 is a cross-sectional view of an electrooptic device housing after completion of the assembly steps.

FIG. 2 is a top view of an electro-optic device housing mounted in a collet electrode having a tightening means.

FIG. 3 is a cross-sectional view of an electrooptic device housing mounted in a collet electrode with a tightening ring and a second electrode.

DETAILED DESCRIPTION OF THE INVENTION

An assembled electro-optic device housing 10, shown in FIG. 1, comprises a header 12 with electrodes 14 inserted therethrough for supplying power or extracting electrical signals from an electro-optic device 26 mounted either on the header 12 or on a mounting block 24; and a cap 15 which comprises a wall 16, typically of stainless steel, into which is mounted a window 20. The electrooptic device 26 may be either a light source, such as a light emitting diode or injection laser, or a light detector, such as a depletion layer photodiode or an avalanche photodiode. The window 20 is joined to the wall 16 at a joint 22 so as to form an hermetic seal therebetween. This seal is typically formed by soldering a metallized glass window to the wall or by fusing the window to the wall. The methods used for forming the glass to metal seal result in a high sensitivity to heat of the joint 22. Excessive heat can result in the opening of holes in the joint 22 or in the cracking of the window 20.

The cap 15 and header 12 are joined together to form an hermetic seal at a header to cap seal 18.

A welding jig 40 for forming a butt weld between the cap 15 and the header 12 is shown in FIGS. 2 and 3. The welding jig 40 comprises a collet electrode 41 and a second electrode 44.

The collet electrode 41 comprises a cylindrical tube, preferably of copper, having a wall 42 into which are cut a series of slots 54 preferably equally spaced along the tube perimeter and which extend from the inside surface to the outside surface of the wall 42. The slots 54 extend from an end 43 of the tube along the length of the tube a distance which is preferably about five times the thickness of the wall 42. The slots 54 are typically about 0.02 cm wide.

As the number of slots in the collet electrode wall 42 increases, the flexibility of the collet electrode wall 42 increases. I have found that four slots produces a low yield of acceptable weld joints while twelve slots produces a very high yield of acceptable weld joints.

Tightening means, such as a tightening clamp 48, is mounted circumferentially about the collet electrode 41 at the end 43 and is supported on a lip 46 of the collet electrode wall 42. The tightening clamp 48 compresses the collet electrode wall 42 by means of a tightening screw 50. A spacer slot 52 in the tightening clamp 48 allows the tightening clamp 48 to compress.

An inner lip 56 on the inside diameter of the collet electrode wall 42 is provided to support the wall 16 of the cap 15.

To weld the cap 15 to the header 12, the window 20 is first mounted and sealed to the wall 16. The cap 15 is then inserted into the collet electrode 41 with the wall 16 resting on the inner lip 56 of the collet electrode wall 42 and with the open end of the cap 15 projecting beyond the end 43. The tightening clamp 48 is then tightened to hold the cap 15 in place in the collet electrode 41 and to provide a radially inwardly directed compressive force on the wall 16 which serves to provide good electrical and thermal contact to the wall 16 and to maintain the glass-to-metal seal under compression during the welding process.

The header 12 is then mounted on the cap 15 at the header to cap seal 18. The second electrode 44, preferably of copper, is then mounted on the header 12 to force the header 12 against the wall 16 of the cap 15 at the header to cap seal joint 18.

Electrical means (not shown) are then attached to the collet electrode 41 and the second electrode 44 for transmitting a pulse of electrical energy between the collet electrode 41 and the second electrode 44 sufficient to weld the header 12 to the wall 16 of the cap 15 at the header to cap seal joint 18. Typical parameters for the welding operation are an electrical energy pulse of about 100 kilowatts for about 16 milliseconds at about a 40% duty cycle with a force of about 475 kilograms applied to force the header 12 against the wall 16 of the cap 15 at the header to cap the seal joint 18.

Using this method a butt weld between the cap 15 and the header 12 is formed which provides a hermetic seal therebetween without the use of projecting flanges.

The use of a collet electrode provides a circumferentially uniform coaxial contact to the wall 16 of the cap 15. Such contact provides (a) good electrical contact to the wall 16 so that heat is not generated by contact resistance at the collet electrode-wall interface; (b) good thermal contact at the collet electrode-wall interface so that the collet electrode serves as a heat sink for heat generated at the weld joint, thereby protecting the heat sensitive window to metal seal from damage; and (c) a radially inwardly directed force which maintains the wall under compression during the welding cycle thus preventing undesirable thermal expansion at the glass to metal seal.

I claim:

1. A method for resistance welding a cap, having a wall and a window mounted therein with a heat sensitive glass-to-metal seal, to a header to form a housing which consists essentially of, mounting said cap in a collet electrode;

tightening the collet electrode about said cap for compressing the wall of said cap sufficient to maintain said glass-to-metal seal under compression and for providing thermal and electrical contact to the wall of said cap;

mounting said header on said cap;

mounting a second electrode on the perimeter of said header for forcing said header against an end of the wall of said cap; and passing an electrical energy pulse of sufficient magnitude between the collet electrode and the second electrode through said header and the wall of said cap so as to weld said cap and said header together whereby said heat sensitive glass-to-metal seal is not disturbed.

2. A method according to claim 1 wherein said collet electrode is tightened about said cap by tightening means extending circumferentially about said collet electrode.

* * * * *

UNITED STATES PATENT AND TRADEMARK OFFICE
CERTIFICATE OF CORRECTION

PATENT NO. : 4,217,683

DATED : August 19, 1980

INVENTOR(S) : Rene Eugene Cardinal

It is certified that error appears in the above-identified patent and that said Letters Patent is hereby corrected as shown below:

<u>In the Heading under Assignee:</u>

Assignee should be --RCA Limited, Montreal, Canada--

Signed and Sealed this

Twenty-third Day of February 1982

[SEAL]

*Attest:*

GERALD J. MOSSINGHOFF

*Attesting Officer*  *Commissioner of Patents and Trademarks*